United States Patent
Cheng et al.

(10) Patent No.: US 8,022,488 B2
(45) Date of Patent: Sep. 20, 2011

(54) HIGH-PERFORMANCE FETS WITH EMBEDDED STRESSORS

(75) Inventors: Kangguo Cheng, Albany, NY (US); Bruce B. Doris, Yorktown Heights, NY (US); Ali Khakifirooz, Albany, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 12/566,004

(22) Filed: Sep. 24, 2009

(65) Prior Publication Data

US 2011/0068396 A1    Mar. 24, 2011

(51) Int. Cl.
*H01L 21/02* (2006.01)
(52) U.S. Cl. ............. 257/408; 257/335; 257/E29.267; 257/E29.269
(58) Field of Classification Search ............. 257/289, 257/335, 344, 346, 408, E29.266, E29.267, 257/E29.269
See application file for complete search history.

(56) References Cited

U.S. PATENT DOCUMENTS

| | | | |
|---|---|---|---|
| 6,599,803 B2 | 7/2003 | Weon et al. | |
| 6,861,318 B2 | 3/2005 | Murthy et al. | |
| 6,885,084 B2 | 4/2005 | Murthy et al. | |
| 6,891,192 B2 | 5/2005 | Chen et al. | |
| 6,946,350 B2 | 9/2005 | Lindert et al. | |
| 7,023,055 B2 | 4/2006 | Ieong et al. | |
| 7,226,842 B2 | 6/2007 | Murthy et al. | |
| 7,329,923 B2 | 2/2008 | Doris et al. | |
| 2005/0082616 A1* | 4/2005 | Chen et al. | 257/350 |
| 2005/0116290 A1 | 6/2005 | de Souza et al. | |
| 2005/0280098 A1 | 12/2005 | Shin et al. | |
| 2006/0014366 A1 | 1/2006 | Currie | |
| 2006/0234488 A1 | 10/2006 | Yihwan et al. | |
| 2006/0234504 A1 | 10/2006 | Bauer et al. | |
| 2008/0006818 A1* | 1/2008 | Luo et al. | 257/19 |
| 2009/0075029 A1* | 3/2009 | Thomas et al. | 428/173 |

OTHER PUBLICATIONS

Mistry, K., et al., "A 45nm Logic Technology with High-k+Metal Gate Transistors, Strained Silicon,9 Cu Interconnect Layers, 193nm Dry Patterning, and 100% Pb-free Packaging", IEDM, 2007, pp. 247-250.
International Search Report/Written Opiinion, May 13, 2011.

* cited by examiner

*Primary Examiner* — Kiesha R Bryant
*Assistant Examiner* — Tucker Wright
(74) *Attorney, Agent, or Firm* — Scully, Scott, Murphy & Presser, P.C.; H. Daniel Schnurmann (57) ABSTRACT

A high-performance semiconductor structure and a method of fabricating such a structure are provided. The semiconductor structure includes at least one gate stack, e.g., FET, located on an upper surface of a semiconductor substrate. The structure further includes a first epitaxy semiconductor material that induces a strain upon a channel of the at least one gate stack. The first epitaxy semiconductor material is located at a footprint of the at least one gate stack substantially within a pair of recessed regions in the substrate which are present on opposite sides of the at least one gate stack. A diffused extension region is located within an upper surface of said first epitaxy semiconductor material in each of the recessed regions. The structure further includes a second epitaxy semiconductor material located on an upper surface of the diffused extension region. The second epitaxy semiconductor material has a higher dopant concentration than the first epitaxy semiconductor material.

14 Claims, 4 Drawing Sheets

HIGH-PERFORMANCE FETS WITH EMBEDDED STRESSORS

BACKGROUND

The present invention relates to a semiconductor structure and a method of fabricating the same. More particularly, the present invention relates to a high-performance semiconductor structure including a bi-layer embedded epitaxy semiconductor source region and drain region.

Mechanical stresses within a semiconductor device substrate have been widely used to modulate device performance. For example, in common silicon technology, hole mobility is enhanced when the channel is under compressive stress, while the electron mobility is enhanced when the channel is under tensile stress. Therefore, compressive and/or tensile stresses can be advantageously created in the channel regions of a p-channel field effect transistor (pFET) and/or an n-channel field effect transistor (nFET) in order to enhance the performance of such devices.

One possible approach for creating a desirable stressed silicon channel region is to form embedded silicon germanium (SiGe) or silicon carbon (Si:C) stressors within the source and drain regions of a complementary metal oxide semiconductor (CMOS) device to induce compressive or tensile strain in the channel region located between the source region and the drain region. There are two common techniques that are employed in the semiconductor industry to form such embedded stressors. The first technique, which can be referred to as a late embedded stressor process, forms an in-situ doped stressor material after extension formation. While this late embedded stressor process provides stress conservation and lower source/drain resistance, the process provides a FET that exhibits poor short channel effects due to the formation of deep and heavily doped source and drain regions. The second technique that is commonly used is an early embedded stressor process in which an undoped epitaxy stressor material is formed prior to performing an extension ion implantation. Although this technique provides improved stress proximity to the device channel, it exhibits stress relaxation by performing the extension ion implantation at this stage of the process. Also, this technique requires complicated first spacers, and has a compatibility issue with high k/metal gate stacks.

Despite these advances in the semiconductor industry, further improvement in embedded stressor technology is needed that provides a good balance between stressor proximity and short channel effects.

BRIEF SUMMARY

The present invention provides a high-performance semiconductor structure and a method of fabricating such a structure. The high-performance semiconductor structure includes a bi-layer embedded epitaxy semiconductor source region and drain region. The first layer of the bi-layer is an undoped or lightly doped epitaxy semiconductor material which fills a substantial portion of recessed regions that are located within a semiconductor substrate at a footprint of at least one gate stack. The first epitaxy semiconductor material produces a strain in the device channel, without degrading short channel effects. The second layer of the bi-layer is an in-situ doped epitaxy semiconductor material whose dopant concentration is substantially greater than the first epitaxy semiconductor material. The second epitaxy semiconductor material provides a dopant source for formation of an extension region with high dopant activation. Moreover, the second epitaxy semiconductor material provides superior short channel control and lowers the external resistance of the resultant structure. The high-performance semiconductor structure does not include a traditional deep and heavily doped source region and a traditional deep and heavily doped drain region. As such, the structure has better strain conservation and better short-channel control.

In one aspect of the invention, a high-performance semiconductor structure is provided that includes at least one gate stack, e.g., FET, located on an upper surface of a semiconductor substrate. The structure further includes a first epitaxy semiconductor material that induces a strain upon a channel of the at least one gate stack. The first epitaxy semiconductor material is located at a footprint of the at least one gate stack and it is present substantially within a pair of recessed regions within the substrate which are present on opposite sides of the at least one gate stack. A diffused extension region is located within an upper surface of the first epitaxy semiconductor material in each of the recessed regions. The structure further includes a second epitaxy semiconductor material located on an upper surface of the diffused extension region. The second epitaxy semiconductor material has a higher dopant concentration than the first epitaxy semiconductor material.

In another aspect of the invention, a method of fabricating the above described high-performance semiconductor structure is provided. The method includes forming a pair of recessed regions within a semiconductor substrate at a footprint of a gate stack. A first epitaxy semiconductor material having a lattice constant that is different from a lattice constant of the semiconductor substrate is then formed into each of the recessed regions. A second epitaxy semiconductor material having a higher dopant concentration than the first epitaxy semiconductor material is formed atop an upper surface of the first epitaxy semiconductor material. An extension region is formed between the first epitaxy semiconductor material and the second epitaxy semiconductor material by diffusing dopant from the second epitaxy semiconductor material into an upper portion of the first epitaxy semiconductor material. The method can also include forming a metal semiconductor alloy region atop an upper surface of the second epitaxy semiconductor material after extension region formation.

DETAILED DESCRIPTION

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Embodiments of the present invention will now be described in greater detail by referring to the following discussion and drawings that accompany the present application. The drawings of the present application, which are referred to herein below in greater detail, are provided for illustrative purposes and, as such, they are not drawn to scale.

Figure 1:
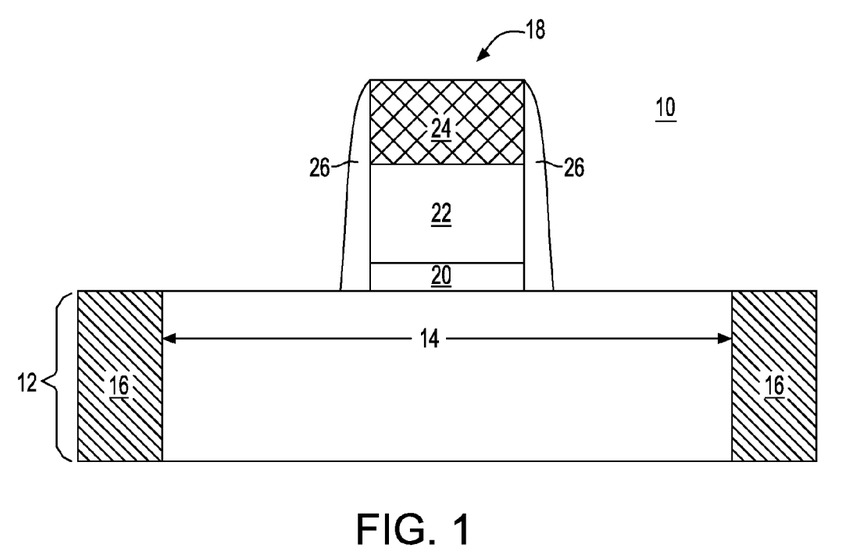
FIG. 1 is a pictorial representation (through a cross sectional view) depicting an initial structure including at least one gate stack located on a surface of a semiconductor substrate that can be employed in one embodiment of the present invention.

Reference is first made to FIG. 1 which illustrates an initial structure 10 that can be employed in one embodiment of the present invention. The initial structure 10 includes a semiconductor substrate 12 having at least one active region 14. The semiconductor substrate 12 also includes at least one isolation region 16. The initial structure 10 further includes at least one gate stack 18 located on an upper surface of the at least one active region 14 of the semiconductor substrate 12. The at least one gate stack 18, which is typically patterned, includes, from bottom to top, a gate dielectric 20, a gate electrode 22 and an optional gate electrode cap 24; gate electrode cap 24 can also be referred to herein as a dielectric cap. A first spacer, e.g., inner spacer, 26 is located on the sidewalls of each of the gate stacks that are present in the initial structure 10.

The initial structure 10 shown in FIG. 1 can be formed by conventional methods and include materials well known to those skilled in the art. For example, the semiconductor substrate 12 of the initial structure 10 can be comprised of any semiconductor material including, but not limited to Si, Ge, SiGe, SiC, SiGeC, GaAs, GaN, InAs, InP and all other III/V or II/VI compound semiconductors. The semiconductor material of the semiconductor substrate 12 has a first lattice constant that is dependent on the type of semiconductor material employed. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In one embodiment of the invention, the semiconductor substrate 12 includes an SOI substrate in which top and bottom semiconductor material layers such as Si are spaced apart by a buried dielectric such as a buried oxide. In other embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a {100} crystal surface, while a pFET is typically formed on a {110} crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

The at least one isolation region 16 is typically formed into the semiconductor substrate 12 so as to form active regions, i.e., device regions, within the semiconductor substrate 12. The at least one isolation region 16 may be a trench isolation region or a field oxide isolation region. The trench isolation region (which is illustrated in FIG. 1) is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The height of the trench isolation region can be adjusted by performing a wet etching process such as etching with a solution containing hydrofluoric acid. The field oxide can be formed utilizing a so-called local oxidation of silicon process.

The various active regions, such as active region 14, may be doped (e.g., by ion implantation processes) to form well regions within the different device regions. For clarity, the well regions are not specifically shown in the drawings of the present application. The well regions for pFET devices typically include an n-type dopant, and the well regions for nFET devices typically include a p-type dopant. The dopant concentration of the well regions of the same conductivity type device may be the same or different. Likewise, the dopant concentration of the well regions of the different conductivity type may be the same or different.

After processing the semiconductor substrate 12, the at least one gate stack 18 is formed utilizing any conventional process that is well known to those skilled in the art. In one embodiment, the at least one gate stack 18 is formed by deposition of various material layers, followed by patterning the deposited material layers via lithography and etching. In another embodiment of the present invention, the at least one gate stack 18 is formed by a replacement gate process that includes the use of a dummy gate material.

Notwithstanding the technique used in forming the at least one gate stack 18, the at least one gate stack 18 includes, from bottom to top, gate dielectric 20, gate electrode 22, and optional gate electrode cap 24. The gate dielectric 20 includes any gate insulating material including for example, an oxide, a nitride, an oxynitride or a multilayer stack thereof. In one embodiment of the invention, the gate dielectric 20 is a semiconductor oxide, a semiconductor nitride or a semiconductor oxynitride. In another embodiment of the invention, the gate dielectric 20 includes a dielectric metal oxide having a dielectric constant that is greater than the dielectric constant of silicon oxide, e.g., 3.9. Typically, the gate dielectric 20 that is employed has a dielectric constant greater than 4.0, with a dielectric constant of greater than 8.0 being more typical. Such dielectric materials are referred to herein as a high k dielectric. Exemplary high k dielectrics include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the gate dielectric 20. Each value of x is independently from 0.5 to 3 and each value of y is independently from 0 to 2.

The thickness of the gate dielectric 20 may vary depending on the technique used to form the same. Typically, the gate dielectric 20 has a thickness from 1 nm to 10 nm, with a thickness from 2 nm to 5 nm being more typical. When a high k gate dielectric is employed as the gate dielectric 20, the high k gate dielectric can have an effective oxide thickness on the order of, or less than, 1 nm.

The gate dielectric 20 can be formed by methods well known in the art. In one embodiment of the invention, the gate dielectric 20 can be formed by a deposition process such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD). Alternatively, the gate dielectric 20 can be formed by a thermal process such as, for example, thermal oxidation and/or thermal nitridation.

The gate electrode 22 of the at least one gate stack 18 comprises any conductive material including, but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayer thereof. In one embodiment, the gate electrode is comprised of metal gate. In one embodiment, the gate electrode is comprised of polycrystalline silicon.

The gate electrode 22 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the gate electrode 22, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed.

The as deposited gate electrode 22 typically has a thickness from 10 nm to 100 nm, with a thickness from 20 nm to 50 nm being even more typical.

In some embodiments of the invention, an optional gate electrode cap 24 can be formed atop the gate electrode 22. The optional gate electrode cap 24 includes a dielectric oxide, nitride, oxynitride or any combination thereof including multilayered stacks. In one embodiment, the optional dielectric electrode cap 24 is comprised of silicon nitride. When the optional gate electrode cap 24 is present, the optional gate electrode cap 24 is formed utilizing a conventional deposition process well known to those skilled in the art including, for example, CVD and PECVD. Alternatively, the optional gate electrode cap 24 can be formed by a thermal process such as, for example, oxidation and/or nitridation. The thickness of the optional gate electrode cap 24 may vary depending on the exact cap material employed as well as the process that is used in forming the same. Typically, the optional gate electrode cap 24 has a thickness from 5 nm to 200 nm, with a thickness from 10 nm to 50 nm being more typical. The optional gate electrode cap 24 is typically employed when the gate electrode 22 is a Si-containing material such as polysilicon.

The initial structure 10 shown in FIG. 1 also includes a first spacer, e.g., inner spacer, 26 whose base is located on an upper surface of the substrate 12. Edges of the first spacer 26 are located on sidewalls of the gate stack 18. The first spacer 26 includes any dielectric material such as, for example, an oxide, a nitride, an oxynitride or any combination thereof. Typically, but not necessarily always, the first spacer 26 is comprised of a different material than the optional gate electrode cap 24. In one embodiment, the first spacer 26 is comprised of silicon oxide or silicon nitride.

The first spacer 26 can be formed utilizing processes that are well known to those skilled in the art. For example, the first spacer 26 can be formed by deposition of the first spacer material, followed by etching. The width of the first spacer 26, as measured at its base, is typically from 2 nm to 50 nm, with a width, as measured at its base, from 5 nm to 15 nm being more typical.

It is observed that although FIG. 1 as well as the remaining drawings show the presence of a single active region 14 and a single gate stack 18, the present invention can also be practiced when more than one active region and/or more than one gate stack is present. When more than one gate stack is present, the different gate stacks can have the same or different gate dielectrics and/or gate electrode materials. Different gate dielectric and gate electrode materials can be obtained utilizing block masks to block formation of one type of material from one region, while forming the material in another region not including the block mask. When more than one gate stack is provided, the gate stacks can be used in forming a FET of the same/or different conductivity type.

Figure 2A:
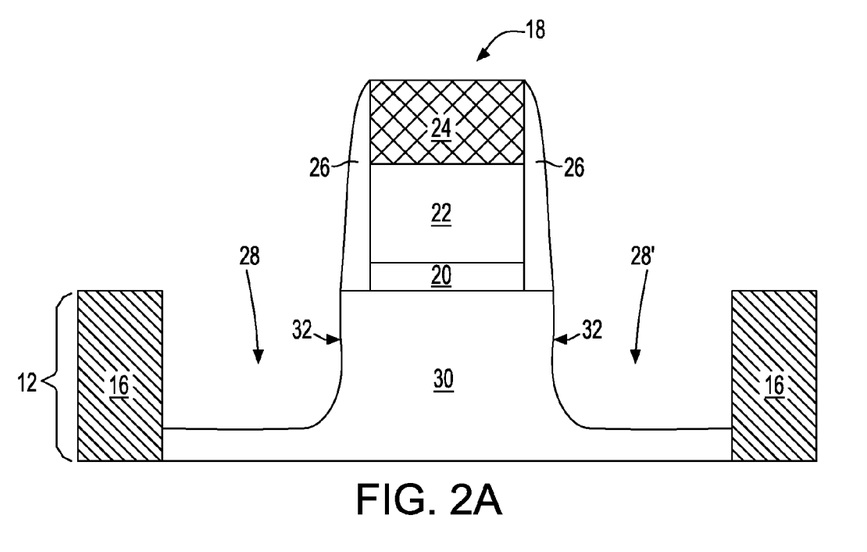
FIG. 2A is a pictorial representation (through a cross sectional view) depicting the initial structure of FIG. 1 after forming a pair of recessed regions within the semiconductor substrate at the footprint of the at least one gate stack.

Referring to FIG. 2A, there is shown the structure of FIG. 1 after forming a pair of recessed regions 28 within the semiconductor substrate 12 at the footprint of the at least one gate stack 18. It is observed that the pair of recessed regions 28 are formed within the substrate 12 on opposite sides of a particular gate stack. The pair of recessed regions 28, e.g., source/drain trenches, is formed utilizing an etching technique that is well known to those skilled in the art. The at least one gate stack 18 and the first spacer 26 serve as an etch mask during the etching process. The depth of the recessed regions 28, as measured from the top surface of the substrate 12 to the bottom of the recessed regions 28, is typically from 20 nm to 150 nm, from 30 nm to 70 nm being more typical.

The etching that can be used in forming the pair of recessed regions 28 includes wet etching, dry etching or a combination of wet and dry etching. In one embodiment, an anisotropic etch is employed in forming the pair of recessed regions 28. In another embodiment, an isotropic etch is employed in forming the pair of recessed regions 28. In a further embodiment, a combination of anisotropic etching and isotropic etching can be employed in forming the pair of recessed regions 28. When a dry etch is employed in forming the pair of recessed regions 28, the dry etch can include one of reactive ion etching (RIE), plasma etching, ion beam etching and laser ablation. When a wet etch is employed in forming the pair of recessed regions 28, the wet etch includes any chemical etchant, such as, for example, ammonium hydroxide that selectively etches the exposed active regions 14 of the semiconductor substrate 12. In some embodiments, a crystallographic etching process can be used in forming the pair of recessed regions 28.

In the embodiment illustrated in FIG. 2A, the etching provides pair of recessed regions 28 within the semiconductor substrate 12 that are separated by a pedestal 30 of semiconductor substrate 12 that has substantially straight sidewalls 32. The substantially straight sidewalls 32 of pedestal 30 may have some taper as shown in FIG. 2A. It is observed that one of the recessed regions forms a source trench within the semiconductor substrate 12, while the other recessed region forms a drain trench within the semiconductor substrate 12.

Figure 2B:
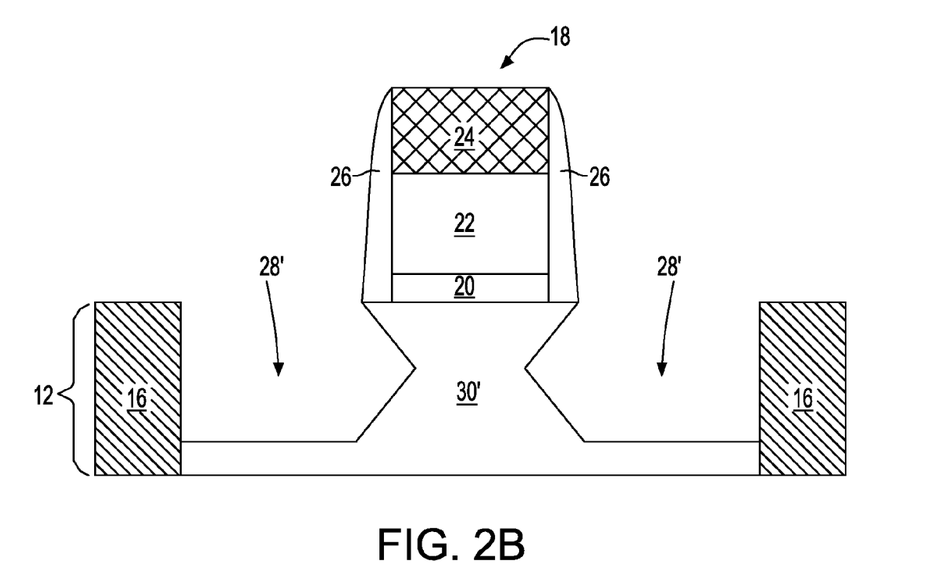
FIG. 2B is a pictorial representation (through a cross sectional view) depicting the initial structure of FIG. 1 after forming a pair of faceted recessed regions within the semiconductor substrate at the footprint of the at least one gate stack.

Referring to FIG. 2B, there is shown an alternative structure that can be formed having a pair of faceted recessed regions 28' that are separate by an hour glass shaped pedestal 30'. The alternative structure shown in FIG. 2B can be formed utilizing a dry etching process, followed by a lateral wet etching process. The lateral wet etch process can include, for example, ammonium hydroxide.

Notwithstanding the type of recessed regions formed, each of the recessed regions 28 is substantially filled with a first epitaxy semiconductor material 34 that has a lattice constant that is different than the lattice constant of the remaining semiconductor substrate 12. For example, when the semiconductor substrate 12 is comprised of silicon, the first epitaxy semiconductor material 34 can be for example, silicon germanium (SiGe), silicon carbon (Si:C), silicon germanium carbon (SiGeC). In one embodiment, and when a pFET is to be formed on a silicon substrate, the first epitaxy semiconductor material 34 is comprised of SiGe. In another embodiment of the invention, and when an nFET is to be formed on a silicon substrate, the first epitaxy semiconductor material 34 is comprised of Si:C.

In one embodiment, the first epitaxy semiconductor material 34 can be undoped, i.e., has a zero dopant concentration. In another embodiment, the first epitaxy semiconductor material 34 is lightly doped. By "lightly doped" it is meant that the first epitaxy semiconductor material 34 can have a dopant concentration of less than $5 \times 10^{18}$ atoms/cm$^3$, with a dopant concentration of less than $1 \times 10^{18}$ atoms/cm$^3$ being more typical. The type of dopant that can be present within the first epitaxy semiconductor material 34 is dependent on the type of device being formed. For example, when the device is a pFET, a dopant atom from Group IIIA of the Periodic Table of Elements including, for example, boron (B), aluminum (Al), indium (In), can be incorporated within the first epitaxy semiconductor material 34. When the device is an nFET, a dopant atom from Group VA of the Periodic Table of Elements including, for example, phosphorus (P), arsenic (As), and antimony (Sb), can be incorporated within the first epitaxy semiconductor material 34.

The first epitaxy semiconductor material 34 can completely fill the pair of recessed regions 28 or partially fill the pair of recessed regions 28. The complete filling of the pair of recessed regions 28 with the first epitaxy semiconductor material 34 includes an embodiment in which the first epitaxy semiconductor material 34 is coplanar with an upper surface of the remaining semiconductor substrate 12. Alternatively, the complete filling of the pair of recessed regions 28 with the first epitaxy semiconductor material 34 includes an embodiment in which the first epitaxy semiconductor material 34 extends above the upper surface of the remaining semiconductor substrate 12. In the illustrated embodiment shown in the drawings, the first epitaxy semiconductor material 34 has an upper surface that is coplanar with an upper surface of the remaining semiconductor substrate 12.

The first epitaxy semiconductor material 34 is formed into the pair of recessed regions 28 utilizing any epitaxial growth process that is well known to those skilled in the art. The epitaxial growth ensures that the first epitaxy semiconductor material 34 is crystalline and has a same crystallographic structure as that of the surface of the semiconductor substrate 12 in which the first epitaxy semiconductor material 34 is formed. In one embodiment, a conformal epitaxial growth process can be employed in forming the first epitaxy semiconductor material 34. The utilization of a conformal epitaxial process ensures that the first epitaxy semiconductor material 34 is conformal to the exposed surfaces of the semiconductor substrate 12 that defines each recessed region. That is, a conformal epitaxial process provides a first epitaxy semiconductor material 34 within the pair of recessed regions 28 that follows the contour of each recessed region. In embodiments in which the first epitaxy semiconductor material 34 is lightly doped, the first epitaxy semiconductor material 34 can be formed utilizing an in-situ doped epitaxial growth process in which the dopant atoms are incorporated into the precursor gas mixture. The types of precursors used in forming the first epitaxy semiconductor material 34 are well known to those skilled in the art.

A second epitaxy semiconductor material 36 is formed on an upper surface of the first epitaxy semiconductor material 34. The second epitaxy semiconductor material 36 can be comprised of the same or different, preferably the same, semiconductor material as the first epitaxy semiconductor material 34. The second epitaxy semiconductor material 36 differs however from the first epitaxy semiconductor material 34 in that the second epitaxy semiconductor material 36 has a higher dopant concentration than the first epitaxy semiconductor material 34. That is, the second epitaxy semiconductor material 36 is highly doped relative to the first epitaxy semiconductor material 34. By "highly doped" it is meant a dopant concentration (p-type or n-type) that is greater than $1 \times 10^{19}$ atoms/cm$^3$, with a dopant concentration of greater than $1 \times 10^{20}$ atoms/cm$^3$ being more typical. In one embodiment of the present application, and when a single crystal Si substrate is used, the second epitaxy semiconductor material 36 comprises pseudomorphic SiGe or Si:C.

The second epitaxy semiconductor material 36 is formed by a conventional epitaxial growth process including the conformal epitaxy process mentioned above with respect to the first epitaxy semiconductor material 34. Any known precursor can be used in forming the second epitaxy semiconductor material 34. In some embodiments of the invention, the first and second epitaxy semiconductor materials can be formed without breaking vacuum between the formation of these materials. In other embodiments, the first and second epitaxy semiconductor material are formed by breaking vacuum between each epitaxial growth step. It is observed that the first and second epitaxy semiconductor materials form a bi-layer embedded epitaxy semiconductor source/drain region of the structure.

Figure 3:
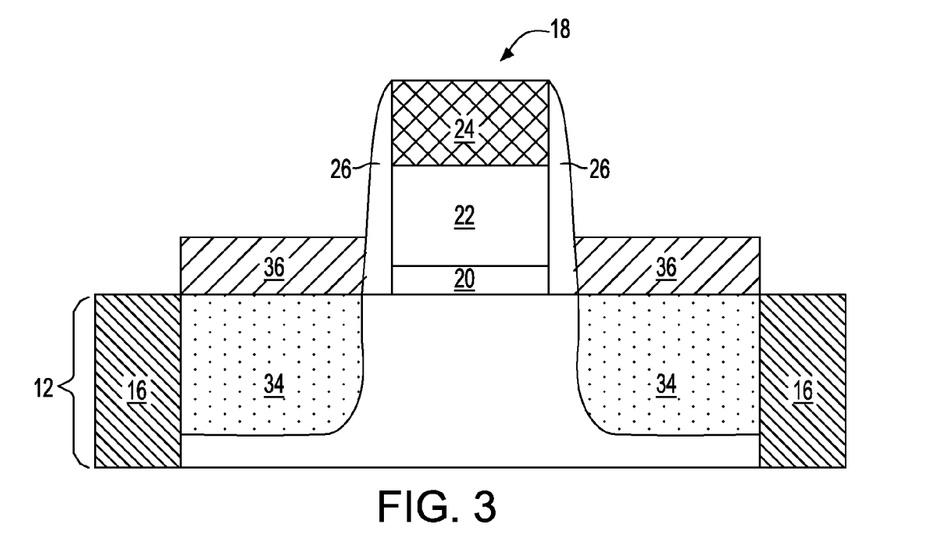
FIG. 3 is a pictorial representation (through a cross sectional view) depicting the structure of FIG. 2A after filling each of the recessed regions with a first epitaxy semiconductor material (undoped or lightly doped) having a lattice constant that is different than the lattice constant of the semiconductor substrate, and after forming a second epitaxy semiconductor material (highly doped compared to the first epitaxy semiconductor material) on an upper surface of the first epitaxy semiconductor material.

FIG. 3 illustrates a structure formed after forming the first epitaxy semiconductor material 34 and the second epitaxy semiconductor material 36 into the pair of recessed regions 28 shown in FIG. 2A. A similar structure would result when filling the pair of recessed region 28' shown in FIG. 2B with a first epitaxy semiconductor material 34 and a second epitaxy semiconductor material 36. It is observed that the first epitaxy semiconductor material 34 imparts strain into the device channel, while the second epitaxy semiconductor material 36 is used to form extension regions in an upper portion of the first epitaxy semiconductor material 36 via a subsequent annealing step. In some embodiments, the second epitaxy semiconductor material 36 forms a raised source/drain region within the structure.

Figure 4:
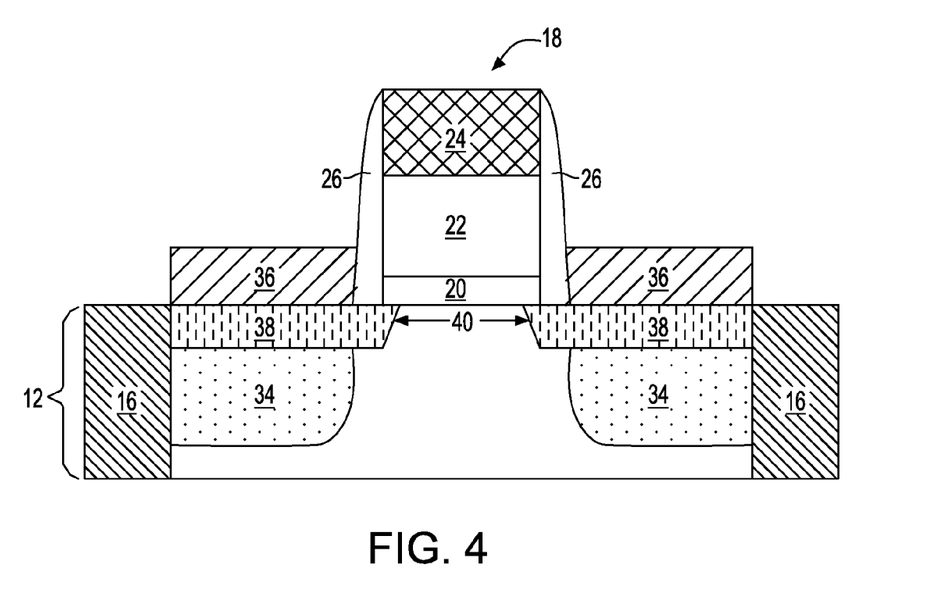
FIG. 4 is a pictorial representation (through a cross sectional view) depicting the structure of FIG. 3 after formation of an extension region within an upper portion of the first epitaxy semiconductor material in each of the recessed regions.

Referring now to FIG. 4 there is illustrated the structure of FIG. 3 after performing an annealing step that drives dopant from the second epitaxy semiconductor material 36 into an upper portion of the first epitaxy semiconductor material 34 forming diffused extension regions 38. In FIG. 4, one of the regions labeled as 38 is a source extension region, while the other region labeled as 38 is the drain extension region. It is observed that during the anneal, the dopant not only diffuses from the second epitaxy semiconductor material 36 into an upper portion of the first epitaxy semiconductor material 34, but some dopant diffusion also occurs into the substrate 12, e.g., pedestal 30, that is located under the at least one gate stack 18 as shown in FIG. 4. The portion of the semiconductor substrate 12, e.g., pedestal 30, that is located beneath the at least one gate stack 18 which is bounded by the diffused extension regions 38 is the device channel 40.

The anneal that is used to drive in dopant from the second epitaxy semiconductor material 36 into an upper portion of the first epitaxy semiconductor material 34 is performed at a temperature that is typically greater than 800° C., with a temperature of greater than 850° C. being more typical. The anneal can be performed utilizing any conventional anneal process that can diffuse a dopant from one layer into another layer. Examples of anneals that can be employed to drive dopant from the second epitaxy semiconductor material 36 into an upper portion of the first epitaxy semiconductor material 34 include, for example, a rapid thermal anneal, a furnace anneal, a laser anneal, a microwave anneal, or a combination of those techniques. The duration of the anneal, i.e., the annealing time, may vary depending on the exact anneal process utilized as well as the temperature of the anneal. Typically, the anneal is performed for a time period of 10 minutes or less. The anneal is typically performed in an inert ambient such as, for example, helium, nitrogen, and/or argon. In some embodiments, the annealing can be performed utilizing a forming gas (a mix of hydrogen and nitrogen).

The depth of the diffused extension region 38 thus formed into the first epitaxy semiconductor material 34 is dependent on the conditions of the anneal that are utilized. Typically, the depth of the diffused extension region 38, as measured from an upper surface thereof that forms an interface with the second epitaxy semiconductor material 36, is from 30 nm or less. More typically, the depth of the diffused extension region 38 is from 5 nm to 15 nm, as measured from an upper surface thereof that forms an interface with the second epitaxy semiconductor material 36.

Figure 5:
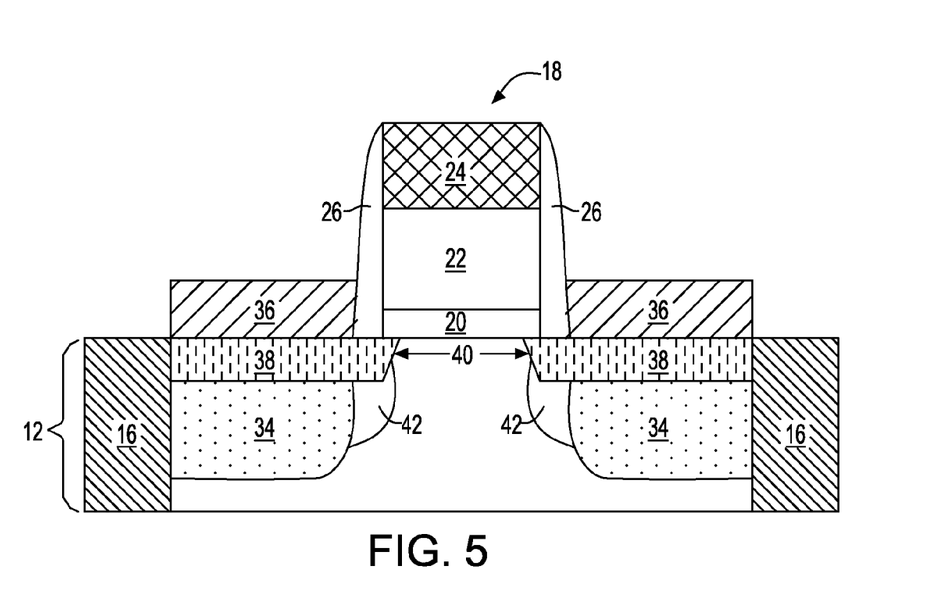
FIG. 5 is a pictorial representation (through a cross sectional view) depicting the structure of FIG. 4 after optional halo region formation.

Referring now to FIG. 5, there is shown the structure of FIG. 4 after performing an optional halo implant that forms optional halo regions 42 within the structure. The optional halo implant can be performed utilizing any conventional halo implant, such as an angled halo ion implant, that is well known to those skilled in the art. After the optional halo implant, an optional halo activation anneal is typically performed at a temperature of 1350° C. or less. In one embodiment, the optional halo activation anneal can include a laser anneal or rapid thermal anneal. In one embodiment, the halo implant is performed after the source/drain epitaxy growth. A single anneal process (e.g., rapid thermal anneal) can then be performed to form extension and activate dopants in the halo regions.

Figure 6A:
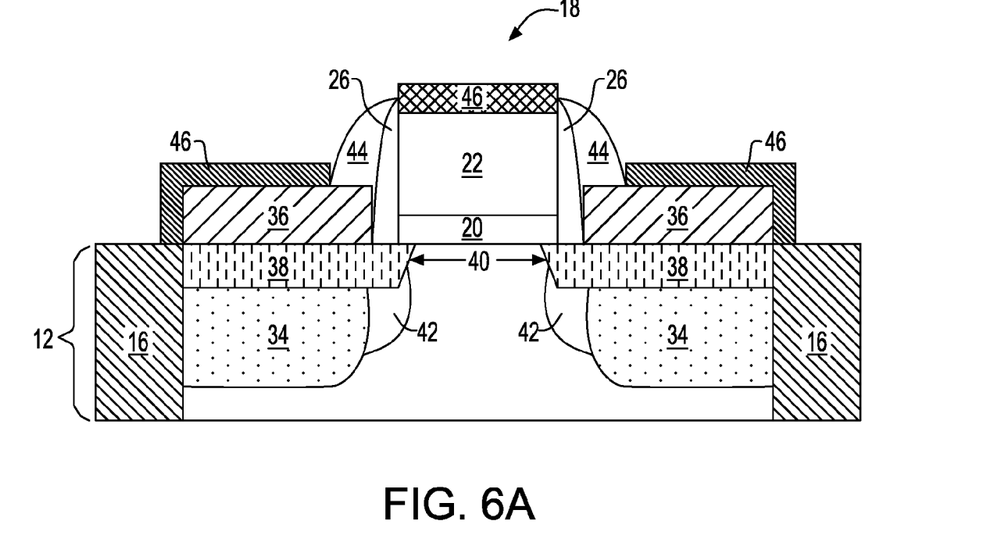
FIG. 6A is a pictorial representation (through a cross sectional view) depicting the structure of FIG. 5 after further processing including, for example, removal of an optional gate electrode cap, formation of a second spacer and metal semiconductor alloy region formation on at least an upper surface of the second epitaxy semiconductor material.

Referring now to FIG. 6A, there is shown the structure of FIG. 5 after further processing including, for example, optional removal of the optional gate electrode cap 24, formation of second spacer (e.g., outer spacer) 44, formation of metal semiconductor alloy, i.e., silicide, regions 46 on at least the second epitaxy semiconductor material 36. In FIG. 6A, a metal semiconductor alloy region can also form atop the gate electrode 22 when the gate electrode 22 is composed of a Si-containing material, and the optional gate electrode cap 24 is removed.

The further processing can also include contact via formation (not shown) and interconnect structure formation (also not shown).

In embodiments in which the optional gate electrode cap 24 is removed from the structure, the removal of the optional gate electrode cap 24 can be performed utilizing an etchant that selectively removes the gate electrode cap material relative to the first spacer 28, the underlying gate electrode 22 and the second epitaxy semiconductor material 36. An example of such an etchant includes, but is not limited to reactive ion etching.

The second spacer 44 is formed utilizing the same or different process as used in forming the first spacer 26. The second spacer 44 can be comprised of the same or different dielectric material as the first spacer 26. In one embodiment, the second spacer 44 is composed of a different dielectric material as compared to the first spacer 26. In some embodiments, and prior to the second spacer 44 formation, the first spacer 26 can be removed and the second spacer 44 is formed in direct contact with sidewalls of gate stack 18. In one embodiment, the second spacer 44 is a wider spacer that the first spacer 26 mentioned above, and the base of the second spacer 44 is located on an upper surface of the second epitaxy semiconductor material 36; a lateral edge of the second spacer 44 is in direct contact with a sidewall of the first spacer 26.

The metal semiconductor alloy regions 46 are formed utilizing any process that is capable of forming a metal semiconductor alloy atop a semiconductor material. In one embodiment of the invention, the metal semiconductor alloy regions 46 are formed utilizing a silicide process. The silicide process can be self-aligned to the outer edge of the second spacer 44. The silicide process includes forming a metal capable of forming a metal semiconductor alloy when reacted with a semiconductor material atop at least the second epitaxy semiconductor material 36. The metal used in forming the metal semiconductor alloy regions 46 can include, but are not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed.

Figure 6B:
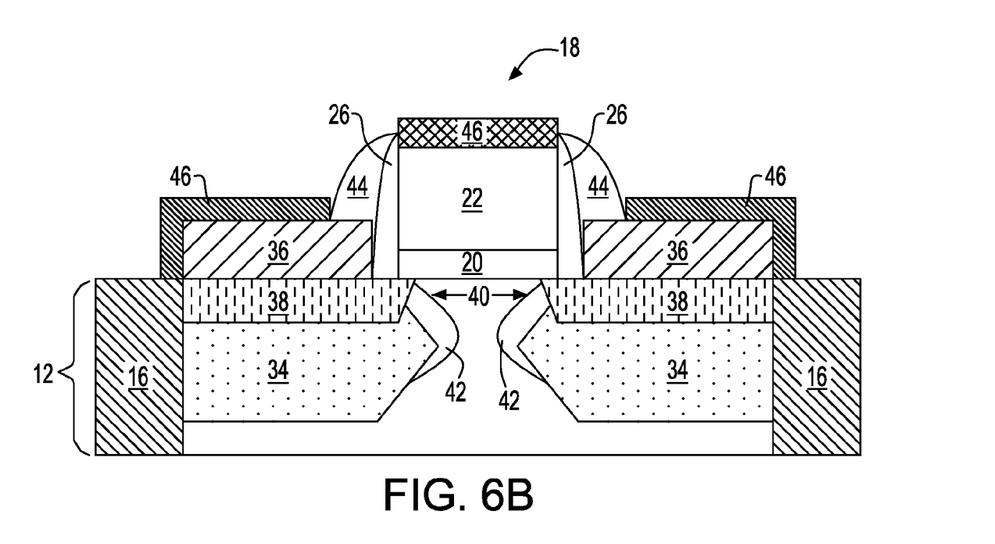
FIG. 6B is a pictorial representation (through a cross sectional view) depicting the structure of FIG. 2B after performing the steps illustrated within FIGS. 3-6A.

FIG. 6B illustrates the resultant structure that can be obtained when the structure shown in FIG. 3B is processed as illustrated in FIGS. 4-6A.

It is observed that FIGS. 6A and 6B illustrate a structure including at least one gate stack 18 located on an upper surface of a semiconductor substrate 12. The structure further includes a first epitaxy semiconductor material 34 that induces a strain upon a channel 40 of the at least one gate stack 18. The first epitaxy semiconductor material is located at a footprint of the at least one gate stack 18 within a pair of recessed regions 28 which are present on opposite sides of the at least one gate stack 18. A diffused extension region 38 is located within an upper surface of said first epitaxy semiconductor material 34 in each of the recessed regions 28. The structure further includes a second epitaxy semiconductor material 36 located on an upper surface of the diffused extension region 38. The second epitaxy semiconductor material 36 has a higher dopant concentration than the first epitaxy semiconductor material 34.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   at least one gate stack located on an upper surface of a semiconductor substrate;
   a first epitaxy semiconductor material located at a footprint of the at least one gate stack substantially within a pair of recessed regions which are present on opposite sides of said at least one gate stack, said first epitaxy semiconductor material induces a strain upon a channel of said at least one gate stack;
   a diffused extension region located within an upper surface of said first epitaxy semiconductor material in each of said recessed regions; and
   a second epitaxy semiconductor material located on an upper surface of said diffused extension region, wherein said second epitaxy semiconductor material has a higher dopant concentration than the first epitaxy semiconductor material.

2. The semiconductor structure of claim 1 wherein said pair of recessed regions is separated from each other by a pedestal of said semiconductor substrate.

3. The semiconductor structure of claim 2 wherein said pedestal has substantially straight sidewalls.

4. The semiconductor structure of claim 2 wherein said pedestal has an hour glass shape.

5. The semiconductor structure of claim 1 wherein said first epitaxy semiconductor material is undoped or has a dopant concentration of less than $5\times10^{18}$ atoms/cm$^3$.

6. The semiconductor structure of claim 1 wherein said second epitaxy semiconductor material has a dopant concentration of greater than $1\times10^{19}$ atoms/cm$^3$.

7. The semiconductor structure of claim 1 wherein said first epitaxy semiconductor material comprises SiGe.

8. The semiconductor structure of claim 1 wherein said first epitaxy semiconductor material comprises Si:C.

9. The semiconductor structure of claim 1 further comprising a halo implant region located within said semiconductor substrate, said halo region is in contact with said diffused extension region and said first epitaxy semiconductor material.

10. The semiconductor structure of claim 1 further comprising a metal semiconductor alloy located at least on an upper surface of said second epitaxy semiconductor material.

11. The semiconductor structure of claim 1 further comprising a first spacer having a base located on a surface of said semiconductor substrate and having a lateral edge in contact with a sidewall of said at least one gate stack, and a second spacer having a base located on an upper surface of said second epitaxy semiconductor material and a lateral edge in contact with a sidewall of said first spacer.

12. The semiconductor structure of claim 1 wherein no deep ion implanted source region or deep ion implanted drain region are present.

13. The semiconductor structure of claim 1 wherein said first epitaxy semiconductor material has an upper surface that is coplanar with, or extends above, said upper surface of said semiconductor substrate.

14. The semiconductor structure of claim 1 wherein said first epitaxy semiconductor material has an upper surface that is located beneath said upper surface of said semiconductor substrate.

* * * * *